(12) United States Patent
Pan

(10) Patent No.: US 7,551,029 B2
(45) Date of Patent: Jun. 23, 2009

(54) TRANSCONDUCTANCE STAGE PROVIDING GAIN CONTROL

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 38 days.

(21) Appl. No.: 11/372,392

(22) Filed: Mar. 10, 2006

(65) Prior Publication Data

US 2007/0210870 A1 Sep. 13, 2007

(51) Int. Cl.
*H03F 3/45* (2006.01)

(52) U.S. Cl. .................................................... 330/254
(58) Field of Classification Search .................. 330/254
See application file for complete search history.

(56) References Cited

U.S. PATENT DOCUMENTS

| 6,462,527 B1* | 10/2002 | Maneatis | 323/315 |
| 6,980,054 B2* | 12/2005 | Okada | 330/257 |
| 7,078,968 B2* | 7/2006 | Gaeta et al. | 330/254 |
| 7,088,180 B2* | 8/2006 | Lee et al. | 330/254 |
| 7,203,511 B2* | 4/2007 | Trachewsky et al. | 455/522 |
| 2006/0097792 A1* | 5/2006 | Ryu et al. | 330/311 |

* cited by examiner

*Primary Examiner*—Robert Pascal
*Assistant Examiner*—Alan Wong
(74) *Attorney, Agent, or Firm*—Sterne, Kessler, Goldstein & Fox P.L.L.C.

(57) ABSTRACT

A transconductance stage providing gain control includes an input stage to convert a first differential input voltage and a second differential input voltage to a first intermediate current and a second intermediate current, respectively. An output stage generates a first output current signal and a second output current signal based on the first and second intermediate currents, respectively. The output stage includes a first plurality of output transistors coupled to a first plurality of corresponding switch resistors and a second plurality of output transistors coupled to a second plurality of corresponding switch resistors. The number of activated switch resistors of the first plurality of switch resistors determines a gain of the first output current signal and a number of activated switch resistors of the second plurality of switch resistors determines a gain of the second output current signal.

21 Claims, 7 Drawing Sheets

TRANSCONDUCTANCE STAGE PROVIDING GAIN CONTROL

BACKGROUND OF THE INVENTION

1. Field of the Invention

The present invention is generally related to transconductance stages. More specifically, the present invention provides a transconductance stage with improved gain control.

2. Background Art

Gain control is often implemented in the baseband portion of a wireless transmitter. A transconductance stage frequently bridges the baseband and radio frequency (RF) sections of a wireless transmitter. Accordingly, robust gain control is often incorporated into the design of a transconductance stage. Many transconductance stages, however, are incapable of accounting for and scaling all baseband DC offsets. Further, these transconductance stages introduce noise into the baseband output signal and inefficiently regulate output current and available voltage headroom.

BRIEF SUMMARY OF THE INVENTION

Accordingly, the present invention is directed to a transconductance stage providing gain control that accounts for all baseband DC offsets and is more efficient in terms of current consumption and use of voltage headroom.

In an embodiment, there is provided a transconductance stage providing gain control. The transconductance stage includes an input stage to convert a first differential input voltage and a second differential input voltage to a first intermediate current and a second intermediate current, respectively. An output stage of the transconductance stage generates a first output current signal and a second output current signal based on the first and second intermediate currents, respectively. The output stage includes a first plurality of output transistors coupled to a first plurality of corresponding switch resistors and a second plurality of output transistors coupled to a second plurality of corresponding switch resistors. The number of activated switch resistors of the first plurality of switch resistors determines a gain of the first output current signal and a number of activated switch resistors of the second plurality of switch resistors determines a gain of the second output current signal. The gain of the first and second output current signals can be adjusted by varying the number of activated switch resistors associated with each output signal.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 5A:
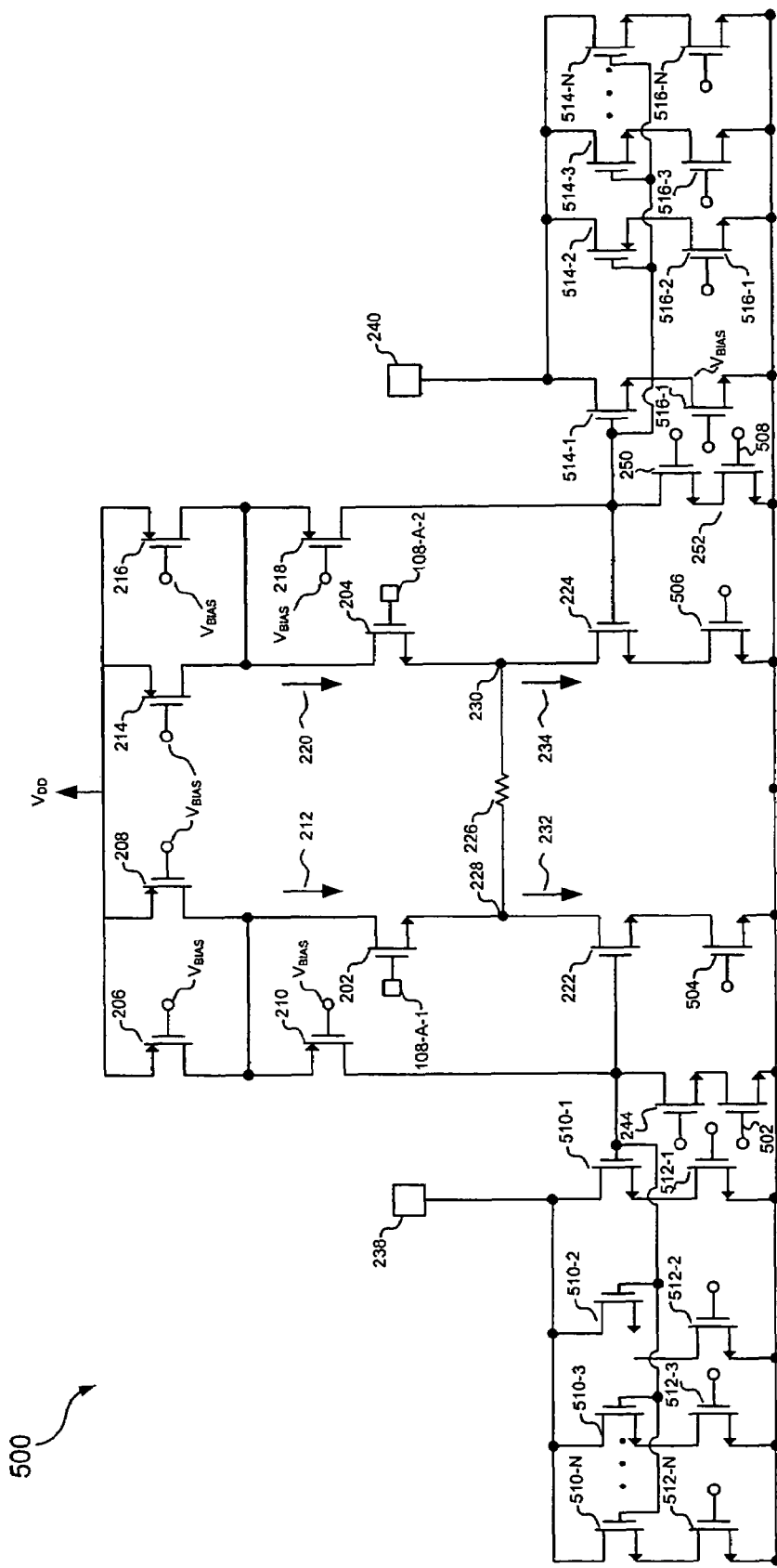
FIG. 5A illustrates a transconductance stage having a gain control mechanism of the present invention.
Figure 5B:
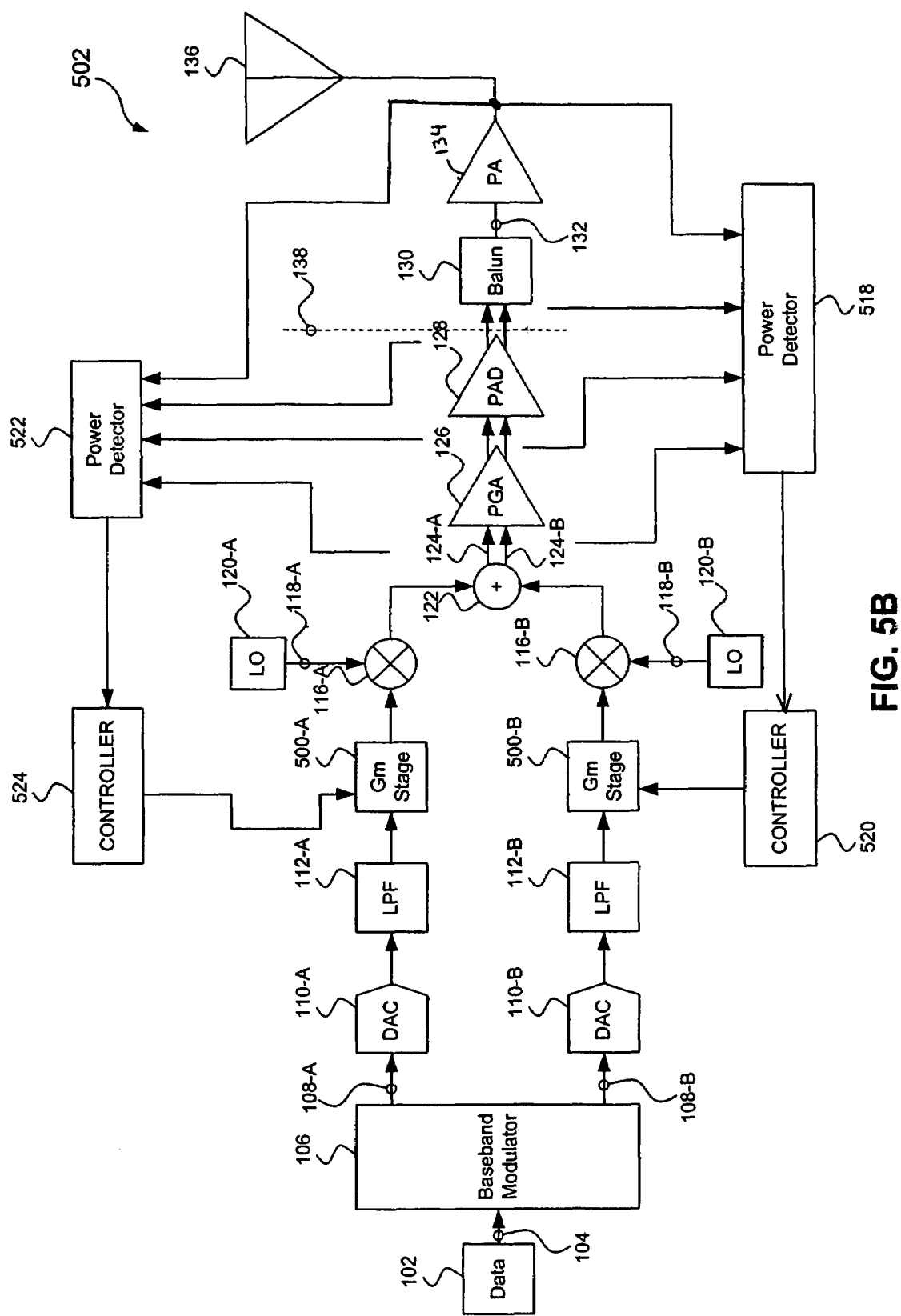

FIG. 5B further illustrates gain control using the present invention.

Figure 6:
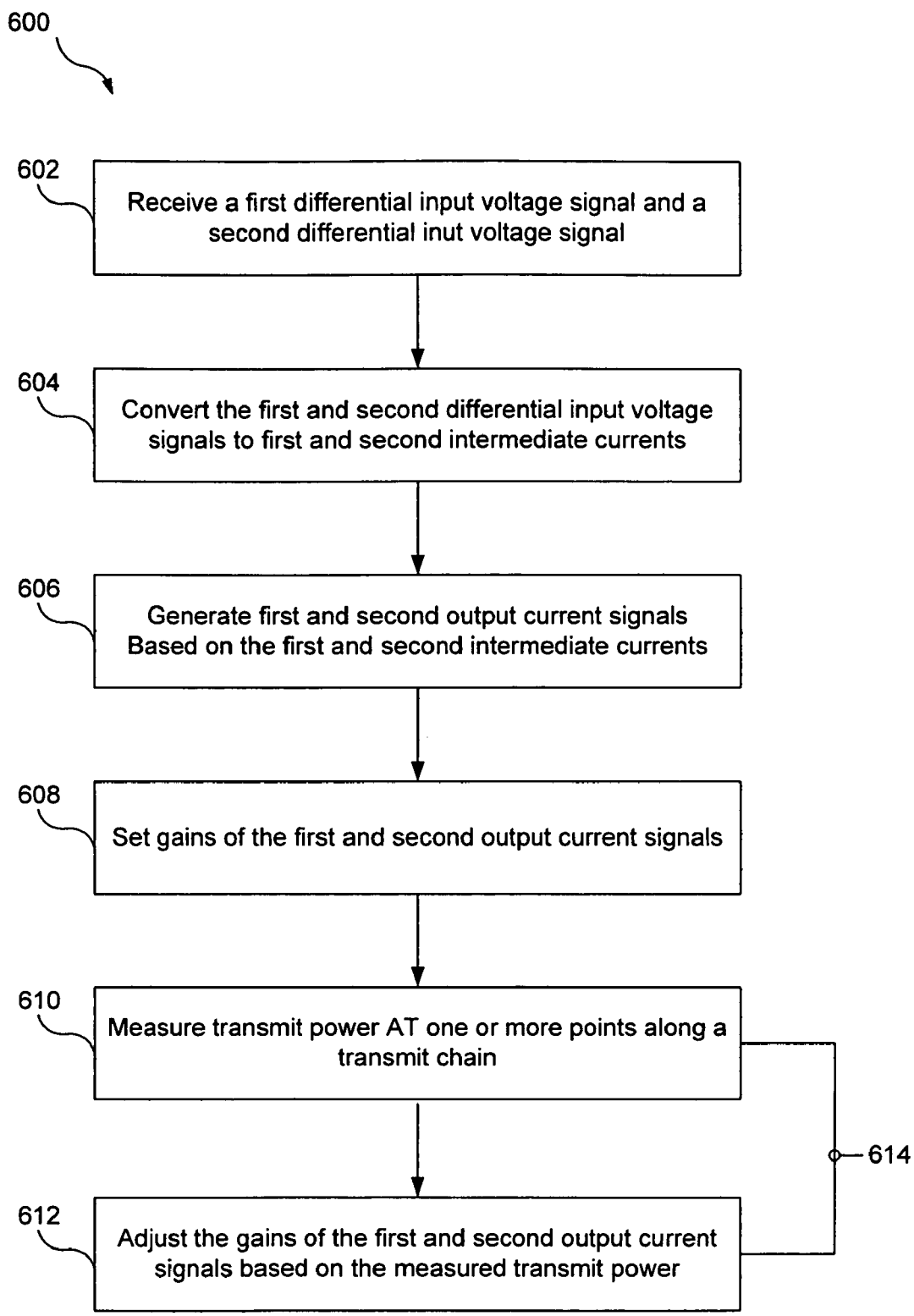

FIG. 6 provides a flowchart that illustrates operational steps for providing gain control in accordance with an aspect of the present invention.

DETAILED DESCRIPTION OF THE INVENTION

Figure 1:
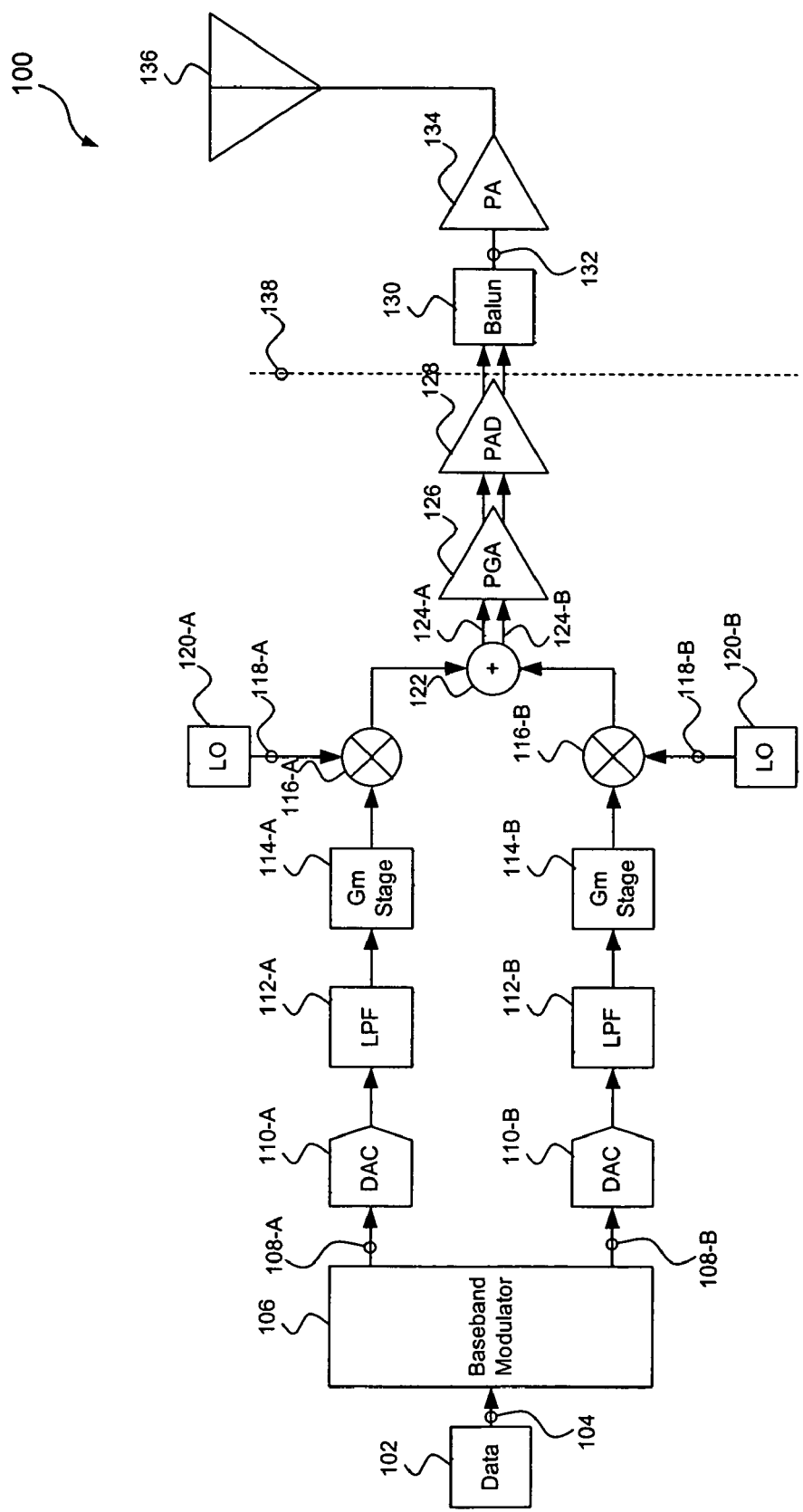
FIG. 1 illustrates a conventional wireless transmitter.

FIG. 1 illustrates a conventional wireless transmitter 100. The conventional wireless transmitter 100 includes an information source 102. The information source 102 generates a data signal 104. The data signal 104 is a sequence of bits. The information source 102 provides the data signal 104 to a baseband modulator 106. The modulator 106 encodes and modulates the data signal 104 and provides two modulation channels (e.g., an in-phase channel and a quadrature-phase channel). Specifically, the baseband modulator 106 generates a modulated data signal 108-A and an associated modulated data signal 108-B. The modulated data signals 108-A and 108-B can be baseband signals or can be signals centered at an intermediate frequency (IF). The modulated data signals 108-A and 108-B are multiple-bit digital signals.

As illustrated in FIG. 1, the modulated data signals 108-A and 108-B are provided to digital-to-analog converters (DACs) 110-A and 110-B and to low-pass filters (LPFs) 112-A and 112-B, respectively. The DAC 110-A converts the modulated data signal 108-A from a digital signal into a differential analog signal. The LPF 112-A isolates an appropriate portion of the modulated data signal 108-A for transmission. Similarly, the DAC 110-B converts the modulated data signal 108-B from a digital signal to a differential analog signal and the LPF 112-B isolates an appropriate portion of the modulated data signal 108-B for transmission.

Filtered versions of the modulated data signals 108-A and 108-B are provided to conventional transconductance ($G_m$) stages 114-A and 114-B, respectively. The conventional transconductance stage 114-A converts the modulated data signal 108-A from a differential voltage signal into a differential current signal. Similarly, the conventional transconductance stage 114-B converts the modulated data signal 108-B from a differential voltage signal into a differential current signal.

The conventional wireless transmitter 100 further includes a pair of mixers 116-A and 116-B. The mixer 116-A receives a carrier signal 118-A from a local oscillator (LO) 120-A. The mixer 116-A up-converts the modulated data signal 108-A to a frequency of the carrier signal 118-A. Similarly, the mixer 116-B receives a carrier signal 118-B from an LO 120-B. The mixer 116-B up-converts the modulated data signal 108-B to a frequency of the carrier signal 118-B. Typically, the modulated data signals 108-A and 108-B are up-converted to a radio frequency (RF) for transmission.

As further illustrated in FIG. 1, the mixers 116-A and 116-B are coupled to an adder 122. The adder 122 sums corresponding differential components of the differential analog signals produced by the mixers 108-A and 108-B. In this way, the adder 122 produces a differential up-converted modulated signal 124 (shown in FIG. 1 as up-converted modulated signals 124-A and 124-B).

The adder 122 is coupled to a programmable gain amplifier (PGA) 126. The adder 122 provides the up-converted modulated signals 124-A and 124-B to the PGA 126. The PGA 126 amplifies the up-converted modulated signals 124-A and 124-B. The gain of the PGA 126 is programmable, or variable, and so can be adjusted during operation of the conventional wireless transmitter 100. The PGA 126 provides the up-converted modulated signals 124-A and 124-B to a power amplifier driver (PAD) 128. The PAD 128 also amplifies the up-converted modulated signals 124-A and 124-B.

The PAD 128 provides the amplified up-converted modulated signals 124-A and 124-B to a balun 130. The balun 130 converts the differential up-converted modulated signals 124-A and 124-B into a single-ended output signal 132. The single-ended output signal 132 is provided to a power amplifier (PA) 134 for amplification. The amplified single-ended output signal 132 is then provided to an antenna 136 for wireless transmission. As illustrated by a chip boundary 138, the balun 130, the PA 134 and the antenna 136 are not located on the same semiconductor chip containing the other elements of the conventional wireless transmitter 100. That is, the balun 118, the PA 134 and the antenna 136 are located "off-chip" while the other elements of the conventional wireless transmitter 100 can reside entirely on a single semiconductor chip.

The conventional wireless transmitter 100 can be a generalized in-phase/quadrature-phase transmitter. Specifically, the conventional wireless transmitter 100 can be adapted to provide a variety of single-ended output signals 120 by varying the modulation schemes used to generate the modulated data signals 108-A and 108-B. Further, the conventional wireless transmitter 100 can be adapted to up-convert the modulated data signals 108-A and 108-B onto a variety of transmission channel bandwidths by altering the LPFs 112-A and 112-B and the carrier signals 118-A and 118-B. That is, by adjusting the operation of the conventional wireless transmitter 100, the conventional wireless transmitter 100 can provide a single-ended output signal 132 that conforms to a variety of communication protocols, standards, or known schemes. For example, the conventional wireless transmitter 100 can be operated according to the Institute of Electrical and Electronics Engineers (IEEE) 802.11a or 802.11 g standard.

The conventional wireless transmitter 100 can operate as a single sideband transmitter. Under ideal conditions, the transmitter output signal 132 produced by the conventional wireless transmitter 100 includes a main information signal only. Under non-ideal conditions, the transmitter output signal 130 includes the main information signal and an LO leakage signal. The LO leakage signal is an undesirable signal that can interfere with the reception and demodulation of the main information signal by a corresponding wireless receiver. Further, the LO leakage signal does not convey information provided by the information source 102.

The LO leakage signal can be caused by baseband DC offsets within the baseband section of the conventional wireless transmitter 100. A baseband DC offset can be caused by a DC offset between the differential components of the modulated data signal 108-A and/or the modulated data signal 108-B. For example, a DC offset between the differential components of the modulated data signal 108-A causes the modulated data signal 108-A, at the input of the mixer 116-A, to include a DC component. As a result, the DC component of the modulated data signal 108-A is up-converted by the carrier signal 118-A and can subsequently appear in the transmitter output signal 132. Overall, DC offsets at the inputs and/or outputs of the DACs 110-A and 110-B, the LPFs 112-A and 112-B and/or the conventional transconductance stages 114-A and 115-B can create and/or enhance an LO leakage signal component of the transmitter output signal 132.

Figure 2:
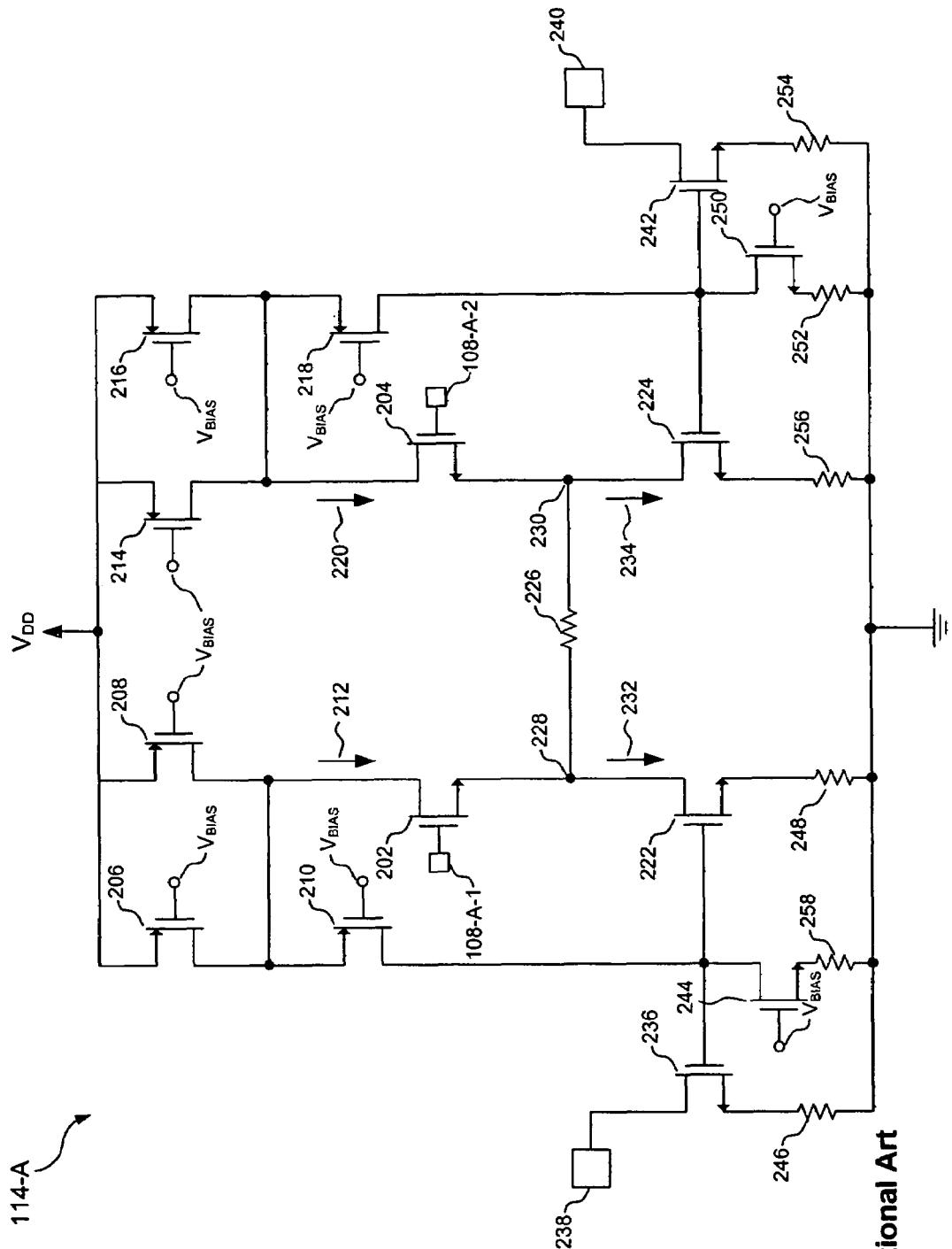
FIG. 2 illustrates a conventional transconductance stage depicted in FIG. 1.

FIG. 2 illustrates the conventional transconductance stage 114-A depicted in FIG. 1. The conventional transconductance stage 114-B is similarly configured and the following discussion of the conventional transconductance stage 114-A is generally applicable to the conventional transconductance stage 114-B.

As shown in FIG. 2, the conventional transconductance stage 114-A includes input N-type metal oxide semiconductor field effect transistors (NFETs) 202 and 204. Input NFET 202 is coupled to a first differential component of the modulated data signal 108-A (shown as modulated data signal component 108-A-1). Input NFET 204 is coupled to a second differential component of the modulated data signal 108-A (shown as modulated data signal component 108-A-2). The input NFET 202 is coupled to P-type FETs (PFETs) 206, 208 and 210. The PFETs 206, 208 and 210 are coupled to a supply voltage $V_{DD}$ and to a bias voltage $V_{BIAS}$. The PFETs 206, 208 and 210 are configured to generate a fixed current 212. The input NFET 204 is coupled to P-type FETs (PFETs) 214, 216 and 218. The PFETs 214, 216 and 218 are coupled to the supply voltage $V_{DD}$ and to the bias voltage $V_{BIAS}$. The PFETs 214, 216 and 218 are configured to generate a fixed current 220.

As further shown in FIG. 2, NFET 222 is coupled to the input NFET 202 and to a degeneration resistor 226. An NFET 224 is coupled to the input NFET 204 and also to the degeneration resistor 226. The NFETs 202 and 222 are configured such that the voltage at a node 228 follows the voltage applied to the input of the input NFET 202 (i.e., the modulated input voltage signal 108-A-1). Similarly, the NFETs 204 and 224 are configured such that the voltage at a node 230 follows the voltage applied to the input of the input NFET 204 (i.e., the modulated input voltage signal 108-A-2).

The degeneration resistor 226 converts the voltage between the nodes 228 and 230 into a current signal. Consequently, a current signal 232 applied to the NFET 222 is varied and a current signal 234 applied to the NFET 224 is varied as the input voltage signals (i.e., the modulated input voltage signals 108-A-1 and 108-A-2) vary. The current signal 232 is mirrored by an NFET 236 and provided to a first output 238 of the conventional transconductance stage 114-A. The current signal 234 is mirrored by an NFET 242 and provided to a second output 240 of the conventional transconductance stage 114-A. In this way, the conventional transconductance stage 114-A converts input voltage signals 108-A-1 and 108-A-2 into current signals 232 and 234, respectively, which are accordingly mirrored or provided to the outputs 238 and 240.

The NFETs 222 and 236 are coupled to an NFET 244. The NFET 244 is coupled to the bias voltage $V_{BIAS}$ and to a degeneration resistor 258. The NFET 236 is coupled to a degeneration resistor 246 and the NFET 222 is coupled to a degeneration resistor 248. Each degeneration resistor 258, 246 and 248 is coupled to a ground. The degeneration resistors 258, 246 and 248 improve the linearity of the conventional transconductance stage 114-A at the first output 238.

The NFETs 224 and 242 are coupled to an NFET 250. The NFET 250 is coupled to the bias voltage $V_{BIAS}$ and to a degeneration resistor 252. The NFET 242 is coupled to a degeneration resistor 254 and the NFET 224 is coupled to a degeneration resistor 256. Each degeneration resistor 252, 254 and 256 is coupled to a ground. The degeneration resistors 252, 254 and 256 improve the linearity of the conventional transconductance stage 114-A at the second output 240.

The degeneration resistor 226 can be considered to represent a division between the input stage portion and the output stage portion of the conventional transconductance stage 114-A. That is, the constituent components of the conventional transconductance stage 114-A depicted above the degeneration resistor 226 can be considered part of the input stage. Accordingly, the constituent components of the conventional transconductance stage 114-A depicted below the degeneration resistor 226 can be considered part of the output stage.

The first output 238 and second output 240 of the conventional transconductance stage 114-A represent the end of the baseband portion of the conventional wireless transmitter 100. As previously mentioned, any DC offsets within the baseband portion of the conventional wireless transmitter 100 can cause or enhance an LO leakage signal in the output signal 132. Since the conventional transconductance stage 114-A is positioned at the end of the baseband portion of the conventional wireless transmitter 100, it is often desirable to implement a gain control mechanism within a transconductance stage to counteract baseband DC offsets.

Figure 3:
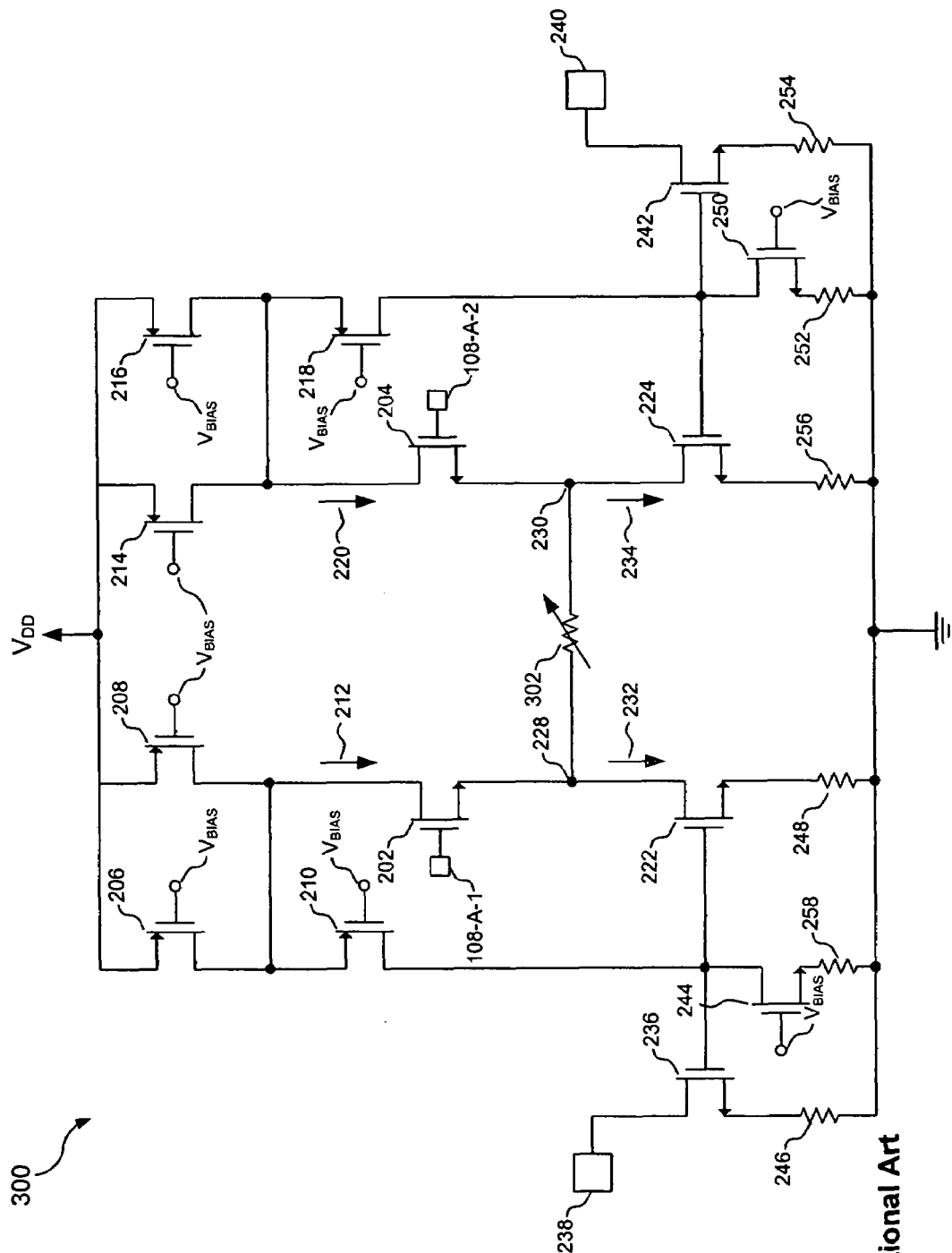
FIG. 3 illustrates the conventional transconductance stage depicted in FIG. 2 having a first gain control mechanism.

FIG. 3 illustrates a conventional transconductance stage 300 that is similar to the conventional transconductance stage 114-A, but has a first gain control mechanism. As shown in FIG. 3, the conventional transconductance stage 300 includes a variable degeneration resistor 302. Gain control is provided by adjusting the value of the variable degeneration resistor 302. Specifically, the gain of the conventional transconductance stage 300 is decreased by increasing the value of the variable degeneration resistor 302 such that the output current signals generated by the conventional transconductance stage 300 are decreased. Correspondingly, the gain of the conventional transconductance stage 300 is increased by decreasing the value of the variable degeneration resistor 302 such that the output current signals generated by the conventional transconductance stage 300 are increased. Both the DC offset and the output signals generated by the conventional transconductance stage 300 are scaled by adjusting the value of the variable degeneration resistor 302.

The introduction of the variable degeneration resistor 302 provides a simple, elaborate mechanism for gain control. However, the gain control mechanism illustrated in FIG. 3 does not allow the scaling of DC offsets that may occur within the output stage portion of the conventional transconductance stage 300. That is, the gain control mechanism depicted in FIG. 3 only provides the scaling of baseband DC offset that occur prior to the variable degeneration resistor 302. Therefore, any DC offset arising in the output stage of the conventional transconductance stage 300 is not accounted for or scaled. Consequently, a seemingly adequate output signal to DC offset margin generated by scaling the variable degeneration resistor 302 may be reduced by a subsequent DC offset. In turn, a larger LO leakage signal that expected or tolerated can be produced. Further, by not accounting for all DC offsets, a gain adjustment using the gain scaling mechanism depicted in FIG. 3 may require multiple iterations so as to ensure an acceptable output signal to DC offset margin.

Figure 4:
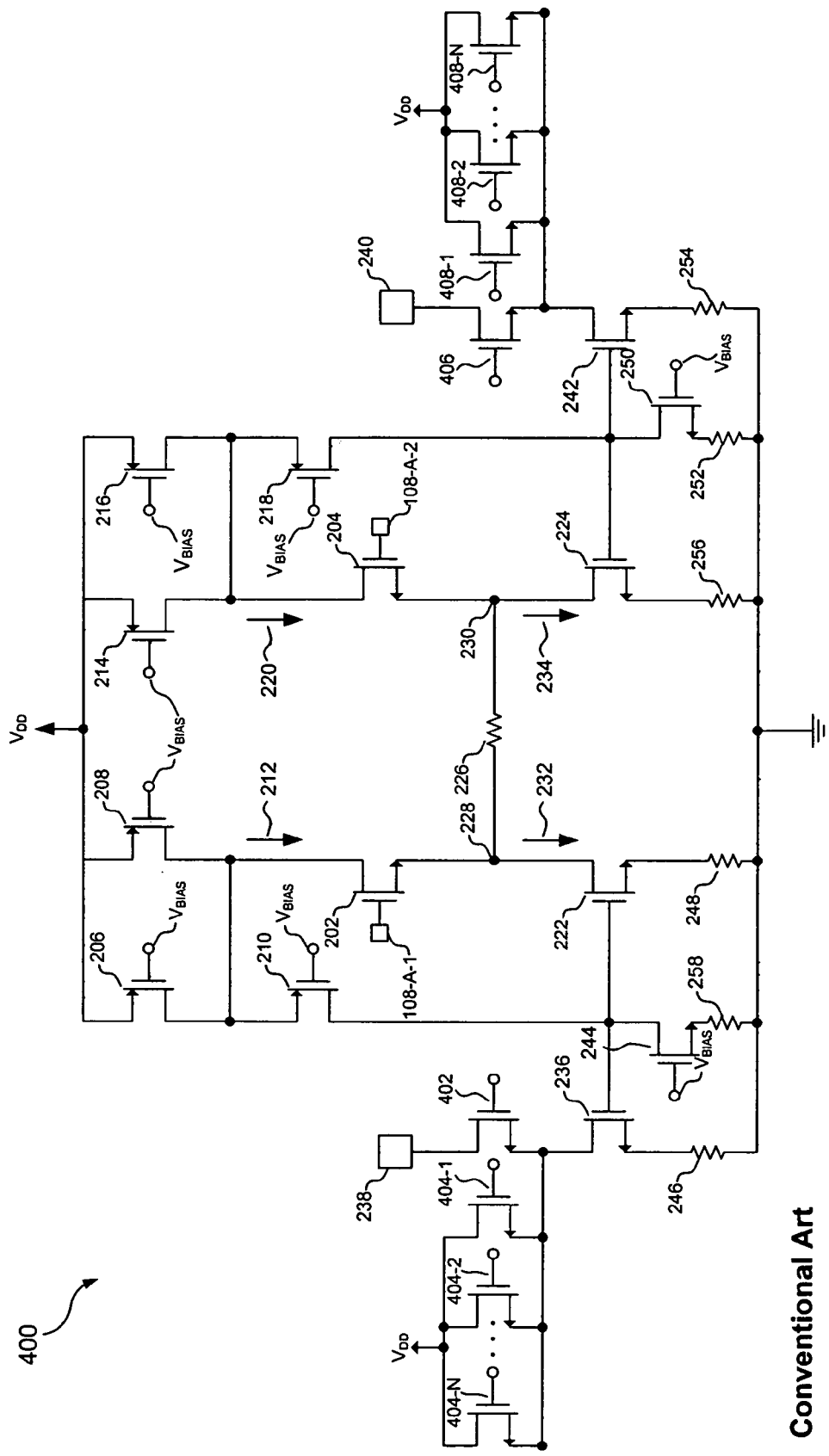
FIG. 4 illustrates the conventional transconductance stage depicted in FIG. 2 having a second gain control mechanism.

FIG. 4 illustrates a conventional transconductance stage 400 that is similar to the conventional transconductance stage 114-A, but has a second gain control mechanism that is different from that shown in FIG. 3. As shown in FIG. 4, the conventional transconductance stage 400 includes an output NFET 402 and a bank of parallel NFETs 404-1 through 404-N. The NFET 402 is coupled between the NFET 236 and the first output 238 of the conventional transconductance stage 400. The NFETs 404-1 through 404-N are coupled between the NFET 236 and the supply voltage $V_{DD}$. The NFET 402 and the NFETs 404-1 through 404-N can be switched on or activated by applying an appropriate bias voltage to the respective gates of the NFETs.

The conventional transconductance stage 400, as depicted in FIG. 4, also includes an output NFET 406 and a bank of parallel NFETs 408-1 through 408-N. The NFET 406 is coupled between the NFET 242 and the second output 240 of the conventional transconductance stage 400. The NFETs 408-1 through 408-N are coupled between the NFET 242 and the supply voltage $V_{DD}$. The NFET 406 and the NFETs 408-1 through 408-N can be switched on or activated by applying an appropriate bias voltage to the respective gates of the NFETs.

The current signal 232 mirrored by the NFET 236 is provided to the first output 238 via the NFET 402. That is, the NFET 402 is activated or switched on to provide the output current signal to the first output 238. To lower the gain at the first output 238, one or more NFETs 404-1 through 404-N are activated. Activating one or more of the NFETs 404-1 through 404-N reduces the magnitude of the current signal provided to the first output 238. Specifically, one or more NFETs 404-1 through 404-N are activated to "siphon off" a portion of the current signal 232 mirrored by the NFET 236. To increase the gain at the first output 238, one or more NFETs 404-1 through 404-N are deactivated. Deactivating one or more of the NFETs 404-1 through 404-N increases the magnitude of the current signal provided to the first output 238. Specifically, one or more NFETs 404-1 through 404-N are deactivated to reduced the portion of the current signal 232 mirrored by the NFET 236 that is "siphoned off."

The operation of the NFET 406 and the NFETs 408-1 through 408-N mimics that of the NFET 402 and the NFETs 404-1 through 404-N to regulate the magnitude of the current signal provided to the second output 240. Together, the NFETs 402-408 provide a gain control mechanism located at the output of the conventional transconductance stage 400. With the gain control mechanism positioned at the output of the conventional transconductance stage 400, all baseband DC offsets can be accounted for and scaled by adjusting the operation of one or more of the NFETs 404-1 through 404-N and/or one or more of the NFETs 408-1 through 408-N. However, the gain control mechanism depicted in FIG. 4 is inefficient since output signal and DC offset scaling is achieved by siphoning off or diverting portions of a generated output signal. Consequently, this gain control mechanism wastes generated current since the output current generated does not scale according to a gain control setting. Further, the introduction of the NFETs at the first output 238 and the second output 240 add distortion to the output current signals generated. Additionally, the voltage headroom of the first output 238 and the second output 240 suffers due to the configuration of the gain control mechanism of FIG. 4. Accordingly, there is a need for a transconductance stage to provide gain control to account for all baseband DC offsets that is more efficient in terms of current consumption and use of voltage headroom.

FIG. 5A illustrates a transconductance stage 500 providing gain control according to an aspect of the present invention. As shown in FIG. 5A, the NFET 244 is coupled to an NFET 502 and the NFET 222 is coupled to an NFET 504. Likewise, the NFET 224 is coupled to an NFET 506 and the NFET 250 is coupled to an NFET 508. The NFETs 502-508 are biased as voltage controlled resistors and improve the linearity of the transconductance stage 500. Specifically, the NFETs 502-508 are precisely fabricated to be of approximately the same size to limit the introduction of DC offsets.

As further shown in FIG. 5A, the NFET 222 is coupled to a plurality of NFETs 510-1 through 510-N. The gates of the NFETs 510-1 through 510-N are each coupled to the gate of the NFET 222 and the sources of the NFETs 510-1 through 510-N are coupled to respective NFETs 512-1 through 512-N. The NFETs 512-1 through 512-N can be activated or deactivated by applying or removing an appropriate bias voltage to the gates of the NFETs 512-1 through 512-N. The NFETs 512-1 through 512-N are configured as voltage controlled switch resistors. As with the NFETs 502-508, the NFETs 512-1 through 512-N are precisely fabricated to be of approximately the same size to limit the introduction of DC offsets.

When an NFET 512 is activated its corresponding NFET 510 contributes to the current output signal provided to the first output 238. Specifically, an NFET 510 mirrors the current signal produced by the NFET 222 when its associated NFET 512 is activated. Accordingly, an NFET 510 does not contribute to the current output signal provided to the first output 238 when its corresponding NFET 512 is deactivated. Any number of NFETs 512-1 through 512-N can be activated or deactivated to increase or decrease the magnitude of the current output signal provided to the first output 238. By adjusting the number of activated or deactivated NFETs 512-1 through 512-N, gain control and DC offset scaling is provided. Maximum gain is achieved by activating all of the NFETs 512-1 through 512-N (i.e., maximum output signal). Minimum gain is achieved by deactivating all of the NFETs 512-1 through 512-N (i.e., minimum output signal).

The NFETs 510-1 through 510-N can be fabricated to be of the same approximate size such that the gain at the first output 238 can be increased or decreased monotonically. The NFETs 514-1 through 514-N and the NFETs 516-1 through 516-N are similarly configured, scaled and operated to provide gain control at the second output 240 of the transconductance stage 500.

As shown in FIG. 5A, the gain control mechanism of the transconductance stage 500 is positioned at the output of the transconductance stage 500. This enables the gain control mechanism of the present invention to scale any baseband DC offset that may be occur prior to (or within) the transconductance stage 500. Accordingly, baseband DC offsets are scaled in proportion with gain control adjustments. Therefore, there is no need to recalibrate baseband operations to account for DC offsets after a gain control adjustment has been made. Further, the gain control mechanism of the transconductance stage 500 efficiently adjusts the magnitude of the output current signals produced by the transconductance stage 500. Specifically, the output current signals are themselves adjusted in proportion with a gain scaling adjustment. For example, a larger output current signal is produced at high gain than the output current signal produced at low gain. Consequently, no output current signal that is generated is wasted or siphoned off when making a gain setting adjustment.

The gain control mechanism of the transconductance stage 500 does not compromise the output headroom of the first output 238 and the second output 240. Further, the linearity of the output of the transconductance stage 500 is improved by the introduction of the NFETs 512-1 through 512-N, the NFETs 502-508 and the NFETs 516-1 through 516-N. These NFETs are coupled to the ground node and so minimize any distortion they may be added to the output of the transconductance stage 500.

The transconductance stage 500 can be implemented as a portion of a single band or multi-band transmitter or receiver. For example, the transconductance stage 500 can be implemented as a stage of a wireless transmitter such as, for example, an IEEE 802.11a/g dual-mode transmitter. Further, a detector/controller can be used to measure output signal power at different points along the transmitter signal path to adjust the gain of the transconductance stage 500 accordingly. For example, FIG. 5B illustrates a transmitter 502 having two transconductance stage 500, (labeled 500-A and 500-B) from FIG. 5A. The transmitter 502 includes a power detector 518 and a controller 520 that are coupled to and control N-FETs 512-1 through 512-N based on the power detected by the power detector 518 along various points of the transmission chain as shown. The controller 520 controls the activation and/or deactivation of the NFETs 512-1 through 512-N to implement gain control adjustments or scaling for the output 238, as discussed above. Likewise, a power detector 522 and the controller 524 provide gain scaling for the output 240 using the NFETs 516-1 through 516-N.

It is to be appreciated by those skilled in the art(s) that the gain control mechanism of the present invention is not limited to the embodiments depicted in FIGS. 5A and 5B. That is, the configuration of the transconductance stages 500 and 502 can be modified to provide the gain control mechanism of the present invention without diverting from the spirit and scope of the present invention as will be appreciated by those skilled in the art(s) from the discussion herein. For example, the transconductance stages 500 and 502 can be configured using other transistor technologies including Bipolar Junction Transistors (BJTs). Further, the transconductance stage 500 can be alternatively configured as a single-ended transconductance stage.

FIG. 6 provides a flowchart 600 that illustrates operational steps for providing gain control in accordance with an aspect of the present invention. The flowchart 600 highlights the operation of a transconductance stage of the present invention (e.g., the transconductance stage 500 depicted in FIG. 5) to provide gain control in accordance with an aspect of the present invention. The invention is not limited to this operational description. Rather, it will be apparent to persons skilled in the relevant art(s) from the teachings herein that other operational control flows are within the scope and spirit of the present invention. In the following discussion, the steps in FIG. 6 are described.

At step 602, a first differential input voltage signal and a second differential input voltage signal is received. The first and second differential input voltage signals can be received by a first stage of a transconductance stage. Further, the first and second differential input voltage signals can be baseband signals. For example, NFETs 202 and 204 in the transconductance stage 502 receives first and second components of a differential input signal.

At step 604, the first differential input voltage signal is converted to a first intermediate current and the second differential input voltage signal is converted to a second intermediate current. The first and second differential input voltage signals can be converted to first and second intermediate currents, respectively, by the first or input stage of the transconductance stage. For example, the differential input signal in transconductance stage 502 is converted to intermediate currents 232 and 234.

At step 606, a first output current signal is generated based on the first intermediate current and a second output current signal is generated based on the second intermediate current. The first and second output current signals can be generated by mirroring or replicating the first and second intermediate currents, respectively. The first and second output current signals can be generated by a second or output stage of the transconductance stage. For example, intermediate currents 232 and 234 in the transconductance stage 502 are mirrored to produce first and second output currents for the output terminals 238 and 240.

At step 608, a gain of the first output current signal is set and a gain of the second output current signal is set. The gain of the first output current signal is set by setting a first number of activated switch resistors coupled to the first output current signal. For example, NFETs 512-1 through 512-N in transconductance stage 502 can be activated/deactivated to perform gain control for the first output current. The gain of the second output current signal is set by setting a second number of activated switch resistors coupled to the second output current signal. For example, NFETs 516-1 through 516-N in transconductance stage 502 can be activated/deactivated to perform gain control for the second output current. The gain of the first and second output current signals can be approximately equal. Specifically, the number of activated switches coupled to the first output current signal can equal the number of activated switches coupled to the second output current signal.

At step 610, transmitted signal power is measured or determined at one or more points along a transmitter chain. For example, the power of the transmitted signal can be determined at an output of a transmitter, or at various intermediate points along the transmitter chain, as shown in FIG. 5B.

At step 612, the gain of the first output current signal and/or the gain of the second output current signal is adjusted. The gain of the first output current signal is adjusted by adjusting the first number of activated switch resistors coupled to the first output current signal. The gain of the first output current signal is increased by increasing the number of activated switch resistors coupled to the first output current signal. The number of activated switch resistors is increased by coupling one or more deactivated switch resistors to a bias voltage. The gain of the first output current signal is decreased by decreasing the number of activated switch resistors coupled to the first output current signal. The number of activated switch resistors is decreased by decoupling one or more activated switch resistors from a bias voltage. For example, control module 520 controls the gates of NFETs 512-1 to 512-N to increase or decrease the gain the gain of the first output current.

The gain of the second output current signal is adjusted by adjusting the second number of activated switch resistors coupled to the second output current signal. The gain of the second output current signal is increased by increasing the number of activated switch resistors coupled to the second output current signal. The number of activated switch resistors is increased by coupling one or more deactivated switch resistors to a bias voltage. The gain of the second output current signal is decreased by decreasing the number of activated switch resistors coupled to the second output current signal. The number of activated switch resistors is decreased by decoupling one or more activated switch resistors from a bias voltage. For example, control module 524 controls the gates of NFETs 516-1 to 516-N to increase or decrease the gain the gain of the second output current.

The gains of the first and second output current signal can be adjusted based on measured power along the transmit chain as shown in FIG. 5B. Further, the gains of the first and second output current signal can be adjusted similarly or differently. Specifically, the gains of the first and second output current signals can be dependently adjusted (i.e., such that the gains are intentionally approximately equal) or can be independently adjusted (i.e., such that the gains are intentionally not equal).

Step 614 illustrates the continuous monitoring and updating of the gains of the first and second output current signals. That is, the gains of the first and second output current signals can be continuously monitored and adjusted to provide an adequate output signal.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A transconductance stage providing gain control, comprising:
    an input stage to convert a first differential input voltage and a second differential input voltage to a first intermediate current and a second intermediate current, respectively; and
    an output stage to generate a first output current signal and a second output current signal based on the first and second intermediate currents, respectively, the output stage including
    a first plurality of output transistors coupled to a first plurality of corresponding switch resistors to provide the first output current signal; and
    a second plurality of output transistors coupled to a second plurality of corresponding switch resistors to provide the second output current signal,
    wherein a number of activated switch resistors of the first plurality of switch resistors determines a gain of the first output current signal and a number of activated switch resistors of the second plurality of switch resistors determines a gain of the second output current signal, and
    wherein the number of activated switch resistors of the first plurality of switch resistors are independently controllable from the number of activated switch resistors of the second plurality of switch resistors.

2. The transconductance stage of claim 1, wherein the gain of the first output current signal is increased when the number of activated switch resistors of the first plurality of switch resistors is increased.

3. The transconductance stage of claim 1, wherein the number of activated switch resistors of the first plurality of switch resistors is increased by coupling a deactivated switch resistor of the first plurality of switch resistors to a bias voltage.

4. The transconductance stage of claim 1, wherein the gain of the second output current signal is increased when the number of activated switch resistors of the second plurality of switch resistors is increased.

5. The transconductance stage of claim 1, wherein the number of activated switch resistors of the second plurality of switch resistors is increased by coupling a deactivated switch resistor of the second plurality of switch resistors to a bias voltage.

6. The transconductance stage of claim 1, wherein the gain of the first output current signal is decreased when the number of activated switch resistors of the first plurality of switch resistors is decreased.

7. The transconductance stage of claim 1, wherein the number of activated switch resistors of the first plurality of switch resistors is decreased by decoupling an activated switch resistor of the first plurality of switch resistors from a bias voltage.

8. The transconductance stage of claim 1, wherein the gain of the second output current signal is decreased when the number of activated switch resistors of the second plurality of switch resistors is decreased.

9. The transconductance stage of claim 1, wherein the number of activated switch resistors of the second plurality of switch resistors is decreased by decoupling an activated switch resistor of the second plurality of switch resistors from a bias voltage.

10. The transconductance stage of claim 1, wherein the input stage comprises:
    a first transistor coupled to the first differential input voltage;
    a second transistor coupled to the second differential input voltage;
    a third transistor coupled to the first transistor; and
    a fourth transistor coupled to the second transistor.

11. The transconductance stage of claim 10, wherein:
    the first plurality of transistors are coupled to the third transistor; and
    the second plurality of transistors are coupled to the fourth transistor.

12. The transconductance stage of claim 10, wherein the input stage further comprises a resistor, wherein a first terminal of the resistor is coupled between the first and third transistors and a second terminal of the resistor is coupled between the second and fourth transistors.

13. The transconductance stage of claim 1, wherein the first plurality of output transistors and the second plurality of output transistors are of approximately the same size.

14. The transconductance stage of claim 1, wherein the number of activated switch resistors of the first plurality of switch resistors is different from the number of activated switch resistors of the second plurality of switch resistors.

15. The transconductance stage of claim 1, wherein the number of activated switch resistors of the first plurality of switch resistors is different from the number of activated switch resistors of the second plurality of switch resistors, so as to correct for a DC Offset present between the first intermediate current and the second intermediate current.

16. A method for providing gain control, comprising:
    receiving a first differential input voltage and a second differential input voltage;
    converting the first and second differential input voltages to first and second intermediate currents, respectively;
    generating first and second output current signals based on the first and second intermediate currents, respectively;
    adjusting gains of the first and second output current signals by adjusting a first number of activated switch resistors coupled to the first output current signal and a second number of activated switch resistors coupled to the second output current signal;
    wherein the gain of the first current output signal is adjusted independently from that of the second current output signal.

17. The method of claim 16, further comprising determining the gains of the first and second current output signals.

18. The method of claim 16, wherein adjusting further comprises increasing the gain of the first output current signal by increasing the first number of activated switch resistors.

19. The method of claim 16, wherein adjusting further comprises increasing the gain of the second output current signal by increasing the second number of activated switch resistors.

20. The method of claim 16, wherein adjusting further comprises decreasing the gain of the first output current signal by decreasing the first number of activated switch resistors.

21. The method of claim 16, wherein adjusting further comprises decreasing the gain of the second output current signal by decreasing the second number of activated switch resistors.

\* \* \* \* \*